United States Patent
Diewald et al.

(10) Patent No.: US 8,185,774 B2
(45) Date of Patent: May 22, 2012

(54) TIMER FOR LOW-POWER AND HIGH-RESOLUTION WITH LOW BITS DERIVED FROM SET OF PHASE SHIFTED CLOCK SIGNALS

(75) Inventors: Horst Diewald, Freising (DE); Joerg Schreiner, Fuerstenfeldbruck (DE)

(73) Assignee: Texas Instruments Incorporated, Dallas, TX (US)

( * ) Notice: Subject to any disclaimer, the term of this patent is extended or adjusted under 35 U.S.C. 154(b) by 462 days.

(21) Appl. No.: 12/465,789

(22) Filed: May 14, 2009

(65) Prior Publication Data
US 2009/0284295 A1 Nov. 19, 2009

Related U.S. Application Data

(60) Provisional application No. 61/141,896, filed on Dec. 31, 2008.

(51) Int. Cl.
*G06F 1/04* (2006.01)
(52) U.S. Cl. ............................. 713/502; 713/320
(58) Field of Classification Search .................. None
See application file for complete search history.

(56) References Cited

U.S. PATENT DOCUMENTS

| 7,512,188 | B1 * | 3/2009 | Watson et al. ................. 375/279 |
| 7,671,317 | B2 * | 3/2010 | Shimomura et al. ....... 250/208.1 |
| 2001/0030565 | A1 | 10/2001 | Ebuchi et al. |
| 2004/0222866 | A1 | 11/2004 | Stengel et al. |
| 2006/0227861 | A1 | 10/2006 | Maksimovic et al. |
| 2008/0024179 | A1 | 1/2008 | Hashim et al. |

FOREIGN PATENT DOCUMENTS

| DE | 103 18 184 | 1/2004 |
| DE | 601 25 785 | 10/2007 |

OTHER PUBLICATIONS

Tietze, U.; Schenk, C.; Halbleiter-Schaltungstechnik. 9. Auflage Berlin: Springer-Verlag, 1991. S. 232-249. ISBN 3-540-19475-4, (in German).

* cited by examiner

*Primary Examiner* — Kenneth Kim
(74) *Attorney, Agent, or Firm* — Robert D. Marshall, Jr.; Wade James Brady, III; Frederick J. Telecky, Jr.

(57) ABSTRACT

The present invention is an electronic device comprising a counter driven by an input clock signal for counting clock cycles and providing most significant bits of a count. A clock signal generating stage provides a first set of phase shifted clock signals having m different phases. The electronic device determines n least significant bits of the count of the counter from the logic states of the first set of m phase shifted clock signals.

20 Claims, 4 Drawing Sheets

TIMER FOR LOW-POWER AND HIGH-RESOLUTION WITH LOW BITS DERIVED FROM SET OF PHASE SHIFTED CLOCK SIGNALS

CLAIM OF PRIORITY

This application claims priority under 35 U.S.C. 119(a) to German Patent Application No. 10 2008 023 536.9 filed May 14, 2008 and under 35 U.S.C. 119(e) (1) to U.S. Provisional Application No. 61/141,896 filed Dec. 31, 2008.

TECHNICAL FIELD OF THE INVENTION

The technical field of this invention is an electronic device comprising circuitry for timing signals.

BACKGROUND OF THE INVENTION

Power consumption of digital circuitry increases with increasing clock frequency. It is desirable to reduce the clock frequency of a clock used for digital signal processing. Sophisticated electronic components require ever higher data throughput and therefore higher clock frequencies. The highest clock frequency in a system determines the highest possible resolution in time. A timer includes a counter, which is typically a chain of flip-flops that is driven by the system clock. The output of each flip-flop represents a single bit of a binary count representing the timer value. The least significant bit (LSB) toggles with half the frequency of the system clock. The next more significant bit toggles with a quarter of the system clock frequency and so on up to the most significant bit (MSB), which toggles with the lowest frequency. Since power consumption is a function of the clock frequency and of the frequency of state changes of the flip-flops, the maximum power consumption is generated in the LSB flip-flops. In a typical application the actual timer value is only requested from time to time, such as in response to a specific event. The binary count contained in the counter is transferred to a register for timing use. The power consumption consumed by the counter can easily be reduced by reducing the clock frequency. This limits the resolution of the timer and the overall performance of the timer.

SUMMARY OF THE INVENTION

It is an object of the present invention to provide a timer, which gives the same resolution of time and performance as a conventional timer, with a reduced clock frequency and power consumption.

According to an aspect of the present invention, an electronic device includes a counter driven by a clock signal counting clock cycles. The counter provides a count. The count is the binary representation of a time value. The electronic device further comprises a clock signal generating stage providing a first set of m phase shifted clock signals having m different phases. The electronic device derives n least significant bits of the count from the logic states of the received first set of m phase shifted clock signals. This can be done continuously or advantageously only at the time of an event. Both numbers n and m are positive integers and m is preferably greater than n. The two numbers can have the relationship $m=2^n$ and the number of MSBs is $N-n$, where N is the bit length of the count. Under these assumptions, the frequency for the counter can be a factor m smaller than in conventional counters. According to this aspect of the invention, the counter produces the time value of a timer. The counter uses a set of phase shifted signals as a representation of time representing the values of LSBs of the count. A major advantage of this invention is use of delayed signals of a lower frequency or longer clock period than the clock period used for the LSBs of a conventional counter achieving the same time resolution in time.

The logic states of the first set of phase shifted signals represent the n LSBs of the count. A code converter stage receives the phase shifted signals and converts the states (e.g. all m states or only some of the states) of the phase shifted signals (e.g. the set of delayed signals) into a digital code of the LSBs of a count.

Because timing may be critical in the conversion step of the code converter stage, a storing means receives and stores the phase shifted clock signals at a specific point of time. This point of time can be defined by an event in the electronic device. An event may relate to an interrupt signal or any other incident at which the value of the LSBs, i.e. the complete count of the counter, is requested. Because code conversion is a time consuming step, it is particularly advantageous to intermediately store the phase shifted values before the code conversion stage.

According to an aspect of the present invention, the clock generating stage includes a first chain of m delay elements. Each delay element has a delay that is smaller than a clock period of the counter clock signal. The first delay element of the first chain of m delay elements receives the clock signal as an input clock signal and generates a first set of m phase shifted clock signals at the outputs of the delay elements of the first chain.

According to an aspect of the present invention, the m delay elements are part of ring oscillator. In other words, the chain of delay elements may preferably be a ring oscillator providing the set of delayed or phase shifted clock signals. The delay of a delay element in the ring oscillator is smaller than a clock period of the counter clock signal. The first delay element of the chain of m delay elements receives the clock signal as an input and generates the first set of m phase shifted clock signals at the outputs of the delay elements of the first chain. As discussed above, the delay of a delay element may be selected in different proportions with respect to the input clock signal, for example as any fraction of the input clock period. Even delays larger than a single clock period may be used. This would cause a delay of the entire delay chain equal to multiples of the clock period of the input clock signal.

The code converter stage receives the outputs of the delay elements of the delay chain or ring oscillator. The code converter stage provides a plurality of least significant bits of the count based on the logic states of the received first set of the m phase shifted clock signals at the time of the event. Instead of using a counter where the least significant bit flip-flop is driven by the maximum clock frequency, the least significant bits of a counter are provided by the set of phase shifted clock signals. Each phase shifted clock signal has the same low clock frequency. The m phase shifted clock signals are delayed with respect to each other by a delay smaller than the period of the minimum clock used for the timer. The delay should be at least smaller than the period of the shifted clock signal. Smaller values of delay are preferred to achieve a higher resolution of time. The delay of a delay element corresponds to the maximum achievable resolution of the timer. The set of phase shifted clock signals provides edges (falling or rising edges), which are distributed over a clock period of the clock signal similar to the edges of a clock signal of a much higher clock frequency. However, the electronic components driven by these clock signals do not consume more power than required by the comparably low clock frequency used for the more significant bit values of the count as they are not used for driving flip-flops or the like.

The states of the respective phase shifted clock signals are used as a binary representation of a specific binary number, which is the content of the least significant bits of the counter. Depending on the number of phase shifted clock signals, the code represented by the set of delayed signals at a specific point of time may be redundant. There may be more codes than possible numbers represented by the least significant bits of the count. However, an advantageous ratio is $m=2^n$. Accordingly, the present invention provides a counter and a timer based on a counter adapted to consume less power than a counter or a timer according to the prior art. This invention provides resolution of time the same as with a counter driven by a clock having a much higher frequency. According to an aspect of the present invention, each delay of the first chain of delay elements have a delay so that the whole chain of delay elements exactly spans one period of the input clock signal. This aspect of the present invention evenly distributes the phase shifted clock signals over one clock period of the input clock signal. The amount of phase shift of the phase shifted clock signals carries the information about the LSBs of the count.

However, according to another advantageous aspect of the invention, the delay of a single delay element of the chain of delay elements may be only a little less than one period of the input clock signal. Furthermore, the whole chain of delay elements may span an integer multiple of one period of the input clock signal. These aspects relate to the recognition that also fractions of a basic clock period can be used to produce a set of phase shifted clock signals, which may then span multiples of periods of the basic clock signal. In this situation the delay of single delay element of a delay chain may be merely a little smaller than one clock period.

According to an aspect of the present invention, the timer has two basic stages. The first stage for the MSBs includes the architecture and the conventional components of a counter. The second stage provides the set of phase shifted clock signals. The second stage may also include the coding stage providing the remaining LSBs of the count. The complete timer includes the first and second stages.

Furthermore, the electronic device may either store the timer value when the complete timer value or the states of the m delayed signals are output from the first counter stage. Since converting the m delayed signals into the timer value may constitute the most critical path, it is advantageous to store the states of the m delayed clock signals between the output of the first counter stage and the input of the code converter stage.

According to another aspect of the present invention, the electronic device comprises a phase or frequency control loop. The phase or frequency control loop synchronizes the set of phase shifted (i.e. delayed) clock signals with the input clock signal. The chain of delay elements of the ring oscillator providing the set of phase shifted clock signals are advantageously part of the control loop. The chain of delay elements or ring oscillator of the control loop operates as the clock generating stage as previously described and provides the first set of m phase shifted clock signals.

In an advantageous aspect of the invention, the more significant bits of the counter are provided by a rather conventional counter stage that is driven by the input clock. The counter stage for the MSBs can then include at least one, but typically a plurality of flip-flops coupled in a chain. The flip-flop for the lowest significant bit of this MSB-stage of the counter receives the input clock signal and is clocked at the input clock frequency. As previously described, the flip-flops of the more significant positions of the counter are driven with respective divided, i.e. slower, clock signals derived from the input clock signal. According to this aspect of the invention the electronic device comprises a counter having two stages; a first stage including the clock generating stage for generating the set of phase shifted signals and a second stage including at least one, but typically a plurality of flip-flops. The set of phase shifted clock signals generated in the clock generating stage is synchronous with the input clock signals, i.e. with the stage for the MSBs. A phase or frequency control loop synchronizes of the input clock signal and the set of phase shifted signals.

According to another aspect of the invention, solves the problem of synchronizing different stages of the counter according to the present invention using one of the clock signals of the set of phase shifted clock signals to drive another stage of the counter. This other stage may include a flip-flop and be the stage that is used for determining the MSBs of the counter.

Advantageously, the control loop includes two digital or voltage controlled oscillators (DCO, VCO). If two controlled oscillators are provided, each oscillator provides a set of phase shifted clock signals. Thus the two oscillators provide first and second sets of m phase shifted clock signals. According to this aspect of the invention, a controlling means switches between the first set of phase shifted clock signals and the second set of phase shifted clock signals. The clock generating stage or the controlled oscillator of the phase/frequency control loop, such as a phase-locked loop, includes first and second chains of delay elements and a controlling means switching between these sets of phase shifted clock signals. The chains of delay elements can advantageously be in a ring oscillator configuration or part of a ring oscillator configuration. The controlled oscillators can be implemented as ring oscillators including the respective chains of delay elements. A phase locked loop (PLL) keeps the set of phase shifted clock signals synchronous with the clock signal (which has the low frequency) used for the more significant bits of the count. The clock signal is fed to the input of the PLL. An oscillator of the PLL synchronously outputs the set of phase shifted clock signals. However, the locking and control operations of the PLL may introduce undesirable modulations through the varying timing of the phase shifted clock signals. Therefore, in order to avoid any modulation of the phase shifted clock signals, either the controlled oscillator or the chain of delay elements is provided twice or adapted to provide two independent sets of phase shifted clock signals. As long as a chain of the delay elements or a controlled oscillator is used to provide the LSBs of a count, the respective first or second chain of delay elements are separated from the phase locked loop. The delay chain or oscillator which provides the set of phase shifted clock signals does not participate in the regulation or control mechanism of the phase locked loop and is frozen as long as the outputs of these delay elements are used as the set of phase shifted clock signals.

According to another aspect of the present invention, an electronic device includes a pulse width modulator. The pulse width modulator includes a clock signal generating stage providing a first set of m phase shifted clock signals having m different phases, a decoding stage coupled to an output of the clock signal generating stage selecting one of the phase shifted clock signals to provide an edge of a pulse of the pulse width modulated signal within a period of the clock signal. In an advantageous implementation, the clock generation stage includes a plurality of delay elements. Each delay element has a delay that is substantially smaller than a clock period of the clock signal used for the pulse width modulator. The delay elements are coupled in a chain, the first delay element in the chain receiving the clock signal as an input signal. This provides a set of phase shifted clock signals at the outputs of the delay elements. A decoding stage receives the outputs of the delay elements and selects one of the phase shifted clock signals to provide an edge of a pulse of the pulse width modulation signal within a period of the clock signal. According to this aspect of the present invention, the pulse width modulator benefits from the basic idea of the present invention. The pulse width modulator uses a set of phase shifted clock signals instead of a high basic clock frequency to achieve a high time resolution. The basic period of the clock signal is not prolonged by a specific delay, but rather is subdivided by the edges of a set of phase shifted clock signals of the same frequency into smaller periods of time. This achieves a resolution that is a factor m higher than in conventional circuits without increasing the circuit complexity or the power consumption.

The present invention is also a method of providing a binary timer value. Accordingly, clock cycles of a clock signal are counted in order to receive a count representing a plurality of most significant bit values of the binary timer value. A set of phase shifted clock signals is generated. Each of the phase shifted clock signals is delayed with respect to another clock signal by less than a clock period of the clock signal. A plurality of least significant bit values based on the states of the phase shifted clock signals of the set of phase shifted clock signals at a point of time of an event is determined. The binary timer value includes the least significant bit values and the most significant bit values. Thus the binary timer value consists partially of the least significant bit values and the most significant bit values. The method according to the present invention saves a considerable amount of power because the clock frequency can be substantially smaller than with a conventional system.

Furthermore, a set of phase shifted clock signals can be used to generate a pulse of a pulse width modulated signal. Each of the phase shifted clock signals is delayed with respect to another delayed clock signal by a delay which is substantially shorter than a clock period of the clock signal. One of the phase shifted clock signals is selected and an edge of the pulse of the pulse width modulated signals is adjusted within a period of the clock signal using the selected clock signal. Accordingly, a higher time resolution can be achieved through the presence of the multiple edges of the set of phase shifted clock signals within a specific time segment of a single clock signal of the set. The time segment may be a period of the input clock signal.

According to an advantageous aspect of the present invention, a delay element can provide a delay of $t_T$. The delay $t_T$ can be $2^{(-k)}/f_{IN}$, with k being an integer number greater than 0 and $f_{IN}$ being the frequency of the input clock signal of the chain of delay elements. Generally, $t_T$ can be any fraction $1/f_{IN}$, but a binary ratio can be advantageous in many applications. In particular, if the number m of delayed clock signals is chosen equal to $2^k$, which means that k=n with n as previously defined, a very advantageous ratio can be achieved.

BRIEF DESCRIPTION OF THE DRAWINGS

These and other aspects of this invention are illustrated in the drawings, in which.

DETAILED DESCRIPTION OF PREFERRED EMBODIMENTS

Figure 1A:
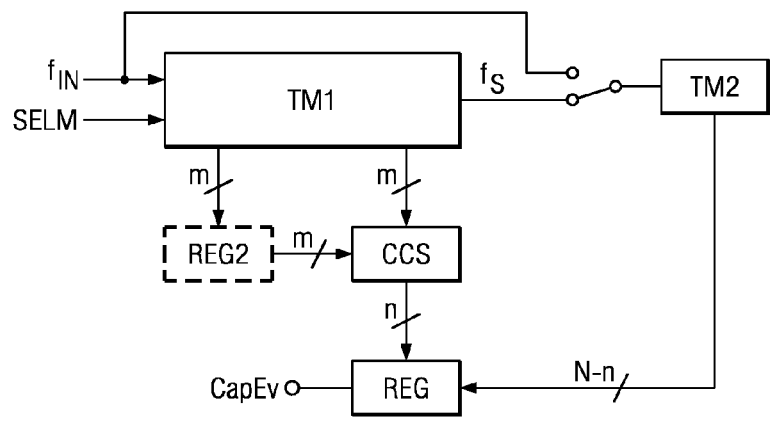
FIG. 1A shows a block diagram of a first embodiment of the present invention.

FIG. 1A shows a simplified block diagram of a first embodiment of the present invention which has an input capture mode. The electronic device includes a first counter stage TM1 and a second counter stage TM2. Both counter stages receive the input clock signal $f_{IN}$ as an input clock signal. The second counter stage TM2 includes a conventional counter which typically includes a chain of storing units such as flip-flops. First counter stage TM1 includes a chain of delay elements (i.e. a ring oscillator) and outputs a set of m phase shifted clock signals to code converter stage CCS. Capture event signal CapEv issues upon occurrence of a specific event. Select timer value signal SELM prompts first counter stage TM1 to output the states of the set of m phase shifted clock signals to code converter stage CCS. Code converter stage CCS converts the states of the set of m phase shifted clock signals into a group of n least significant bits of a count value of bit length n. The number of phase shifted clock signals m can then be defined as $m=2^n$. This number m can also be lower than $2^n$. Second counter stage TM2 provides the remaining more significant bits N−n, where N is the total number of bits of the timer value. Therefore, the N−n MSBs and the n LSBs represent a complete count or a complete timer value of bit length N. This complete count is captured in a register REG of length N in response to a capture event CapEv. The register contents of the register REG can then be compared with a target value in a comparator (not shown) for controlling further components of the circuitry.

According to another aspect of the invention, the electronic device can store the states of the set of m phase shifted clock signals instead or in addition to storing the timer/counter value. This is indicated by an additional optional register REG2 show in dashed lines. Register REG2 is coupled to the output of first counter stage TM1 and to an input of code converter stage CCS. In this embodiment of the invention, the required size of storage means REG2 may be greater than in an embodiment where only the timer/counter value is stored. However, timing requirements are relaxed because code converter stage CCS typically requires the largest amount of time to perform the conversion step.

Input clock signal $f_{IN}$ can drive second counter stage TM2. Alternatively, a clock signal $f_s$ generated in first counter stage TM1 can drive TM2. FIG. 1A illustrates this by a switch connecting either second counter stage TM2 directly to input clock $f_{IN}$ or to an output $f_s$ from TM1. These two configurations may be considered as two different embodiments. Using input clock signal $f_{IN}$ for both stages TM1 and stage TM2 imposes high synchronization requirements on both stages. Furthermore, the delays or phase shifts provided in first counter stage TM1 must be synchronous with clock periods of input clock signal $f_{IN}$. Otherwise, the binary value represented by the set of delayed or phase shifted clock signals from TM1 and the count stored in second stage TM2 may not be compatible with each other, i.e. their combined count may be incorrect. Although synchronization may be performed by use of a phase or frequency control loop, FIG. 1 illustrates a simpler and more reliable solution. Phase shifted clock signal $f_s$, one of the clock signals of the set of phase shifted clock signals, drives second counter stage TM2. The switch indicates that either input clock signal $f_{IN}$ or phase shifted clock signal $f_s$ can be used as a clock signal for second stage TM2. Using phase shifted clock signal $f_s$ allows the point of time at the edges of the input clock signal at which the counter value of second counter stage TM2 changes to be precisely determined.

Figure 1B:
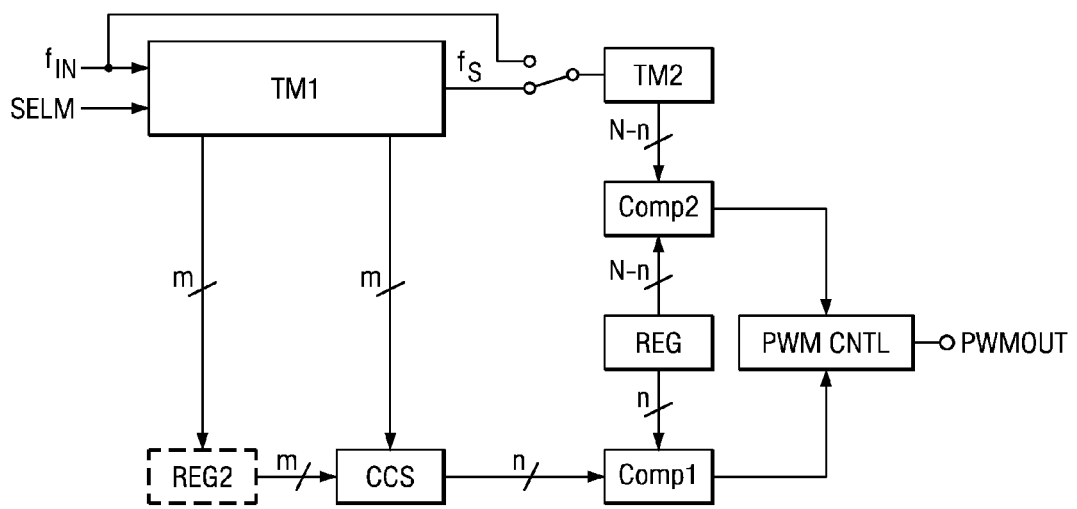
FIG. 1B shows a block diagram of a second embodiment of the present invention.

FIG. 1B shows a simplified block diagram of a second embodiment of the present invention. FIG. 1B is based on the counter shown in FIG. 1A. Similar reference signs or names used in FIGS. 1A and 1B relate to similar functional blocks providing the same functionality. FIG. 1B relates to an output compare mode, where the output signal of the counter stage consisting of TM1 and TM2 is compared to a preset value stored in register REG. The output compare mode can generate pulse width modulated signals. An output of first counter stage TM1 is coupled to code converter stage CCS to supply the m phase shifted clock signals to code converter stage CCS. Code converter stage CCS is coupled to a first comparator stage Comp1. Comp1 receives the n less significant bits (LSBs) from CCS. First comparator stage Comp1 compares the n bits with n bits of a digital value stored in register REG. Pulse width modulator control stage PWMCNTL receives the output signal from first comparator stage Comp1. Pulse width modulator control stage PWMCNTL also receives another comparator output signal from a second comparator stage Comp2. Second comparator state Comp2 compares an N−n bit preset value stored in register REG with the N−n more significant bits output by second counter stage TM2. Pulse width modulator control stage PWMCNTL is driven by the comparator output signals to generate one or more pulses of a specific length. These one pulse or more pulses are output through output pin PWMOUT. The resolution of the pulse can be substantially higher than the one that can be achieved with a conventional system by use of the same clock frequency of the input clock signal $f_{IN}$. Instead of two comparator stages Comp1 and Comp2, only one comparator may be used. The pulse width modulator control stage PWMCNTL can include any control or logic required to generate the pulses. An efficient implementation uses a D-flip-flop. The output of second comparator stage Comp1 used for the LSBs is coupled to a clock input of the D-flip-flop. The data input is coupled to the output of the second comparator stage Comp 2 used for the MSBs of the count.

Figure 2:
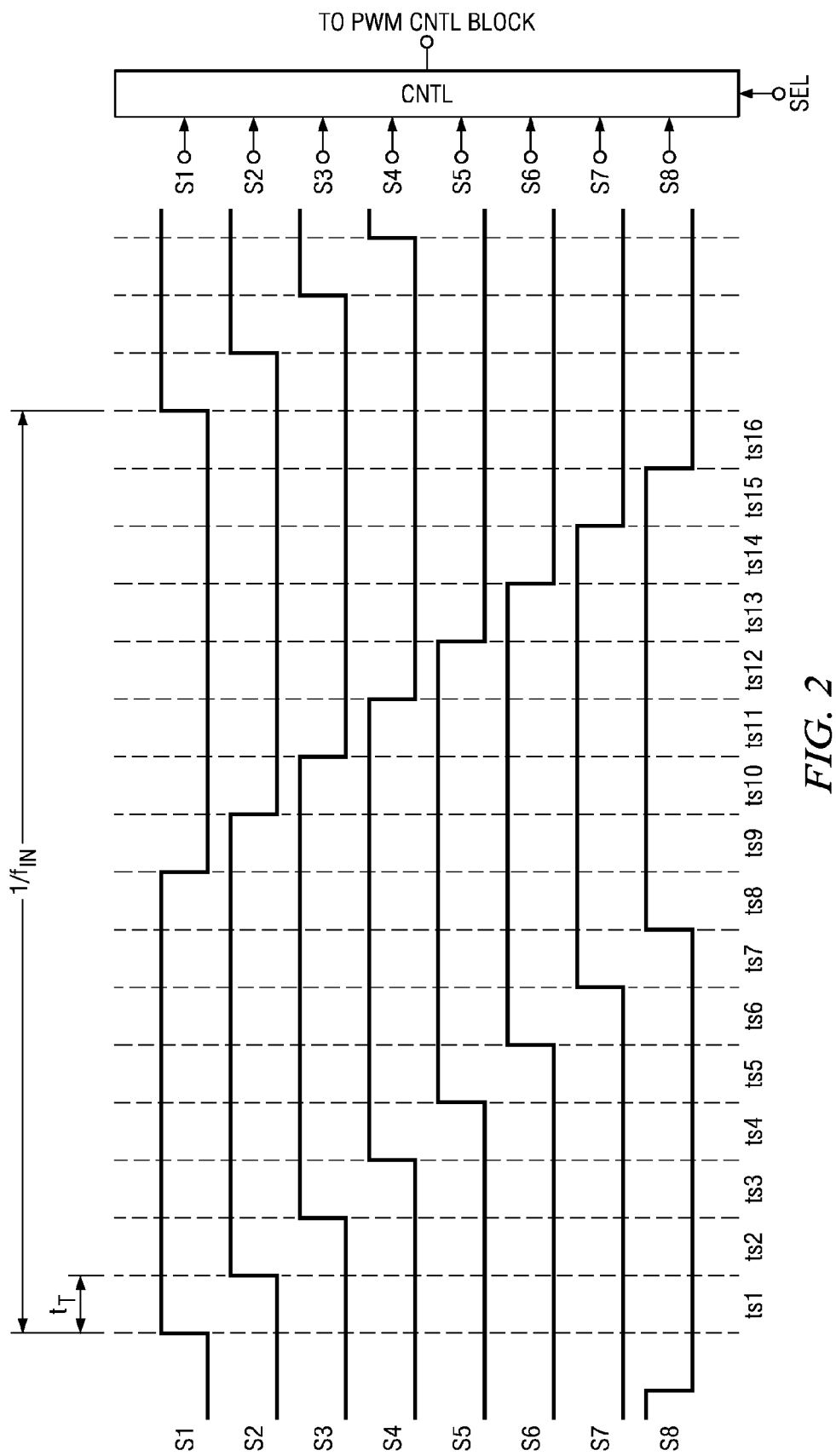
FIG. 2 shows waveforms relating to an embodiment of the present invention.

FIG. 2 shows waveforms relating to a set of phase shifted clock signals S1 to S8 each of which is delayed or phase shifted with respect to a subsequent phase shifted clock signal by a delay of $t_T$. The example shown in FIG. 2 relates to a situation where n can be 2 and m=8. The basic frequency of all the clock signals S1 to S8 shown in FIG. 2 is $f_{IN}$. However, the resolution in time of all the clock signals is much higher than provided by the basic clock frequency $f_{IN}$ of the input clock signal. If an event CapEv occurs (not shown in FIG. 2, see FIG. 3), the states of phase shifted clock signals S1 to S8 are used as a representation of a corresponding n bit value of a count within the corresponding time slice of duration $t_T$. Each time slice ts1 to ts16 has a unique sequence of states of phase shifted clock signals S1 to S8 and can therefore be converted into a corresponding 2-bit number by code converter stage CCS as shown in FIGS. 1A and 1B. Phase shifted clock signals S1 to S8 provide more different states than required for two LSBs of a count. Therefore, code converter stage CCS provides that is adapted to perform the necessary code reduction.

Figure 3:
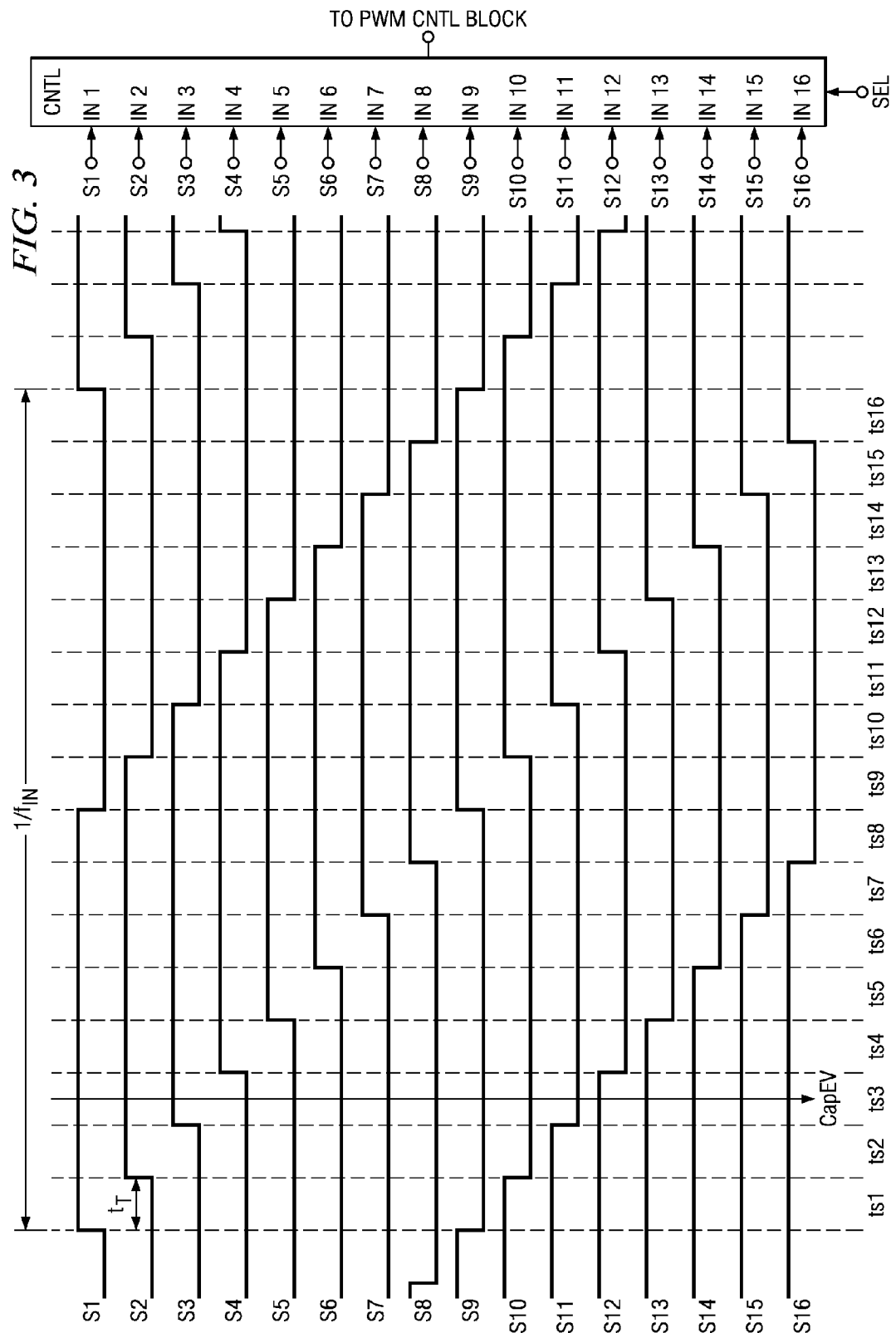
FIG. 3 shows waveforms relating to another embodiment of the present invention.

Another slightly different embodiment is shown in FIG. 3. FIG. 3 illustrates a set of 16 delayed or phase shifted clock signals S1 to S16. Sixteen clock signals S1 to S16 can also be fed to control stage CNTL and a select signal selects one of the sixteen phase shifted clock signals to determine an edge of a pulse of a pulse width modulated control signal. Control stage CNTL can be incorporated in the pulse width modulator control stage PWMCNTL shown in FIG. 1B. The edges of phase shifted clock signals S1 to S16 span a period $1/f_{IN}$ of input clock signal $f_{IN}$ used by the electronic circuit. The rising edges of the set of sixteen phase shifted clock signals S1 to S16 are evenly distributed over a clock period.

It is equally possible to use a set of eight clock signals S1 to S8 as shown in FIG. 2, wherein the rising edges are evenly distributed over the first half period of the input clock signal and the falling edges of the set of phase shifted clock signals are also evenly distributed over the other half clock period. The set of eight delayed clock signals S1 to S8 may be passed through inverters in order provide only rising or only falling clock edges evenly distributed over the entire clock period of the input clock.

Figure 4:
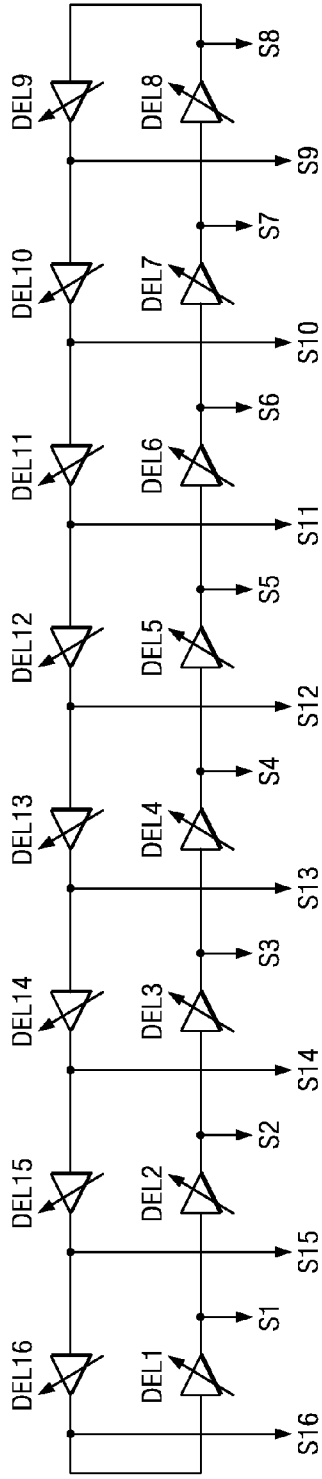
FIG. 4 shows a simplified circuit diagram of a possible implementation of a delay chain according to the present invention.

FIG. 4 shows a simplified circuit diagram of a possible implementation of the delay circuit used for generating the set of phase shifted clock signals S1 to S16 shown in FIG. 3. FIG. 3 illustrates a chain of delay elements DEL1 to DEL16. The respective outputs delay elements DEL1 to DEL15 provide the phase shifted clock signals S1 to S16. Each clock signal has a delay of $t_T$ which is substantially smaller than the period of the clock signal having a clock frequency of $f_{IN}$. Advantageous values for $t_T$ are $t_T=2^{(-k)}/f_{IN}$; where k is an integer greater than 0. The number m of delayed clock signals can be equal to $2^k$. Delay elements DEL1 to DEL16 are configured as a ring oscillator. The ring oscillator may preferably be a controlled oscillator (DCO, VCO). Therefore, the delay of the delay elements can be adjusted in order to adapt the oscillating frequency of the DCO, VCO.

Figure 5:
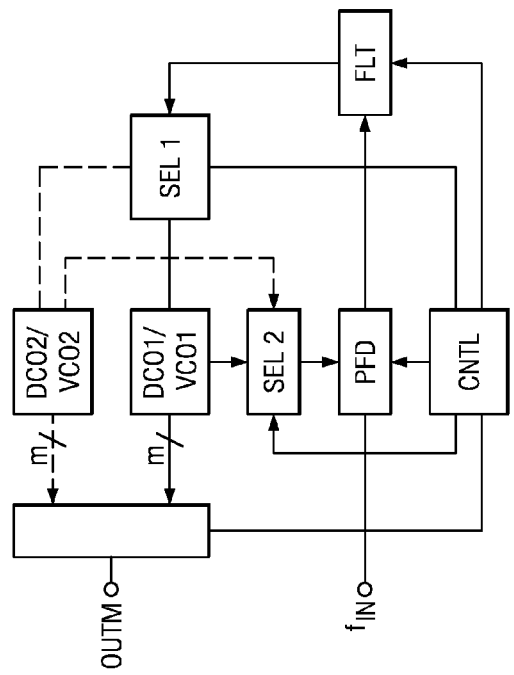
FIG. 5 shows a phase locked loop according to aspects of the present invention.

FIG. 5 shows a phase locked loop according to an aspect of the present invention. The phase locked loop includes a phase frequency detector PFD receiving a clock signal of clock frequency $f_{IN}$. The output of phase frequency detector PFD is passed to filter FLT and then to a first digital or analog controlled oscillator DCO1 or VCO1. Control stage CNTL controls the phase locked loop so that either first oscillator DCO1/VCO1 or second oscillator DCO2/VCO2 is coupled into the loop. Therefore, selection stages SEL1 and SEL2 couple respective inputs and outputs into the loop. In order to avoid any modulation of the delayed output signals, only the first set of delayed output signals S1 to S16 produced by first oscillator DCO1/VCO1 or the second set of delayed output signals S1 to S16 produced by second oscillator DCO2/VCO2 is passed to output OUTM. Thus one of the oscillators is adjusted by phase locked loop including phase frequency detector PFD, filter FLT and the respective oscillator DCO1/VCO1 or DCO2/VCO2. The other oscillator DCO1/VCO1 or DCO2/VCO2 is frozen and provides the output OUTM. After a specific predetermined time, the oscillator not providing output OUTM is coupled into the phase locked loop and adjusted to provide a synchronous output signal OUTM.

Figure 6:
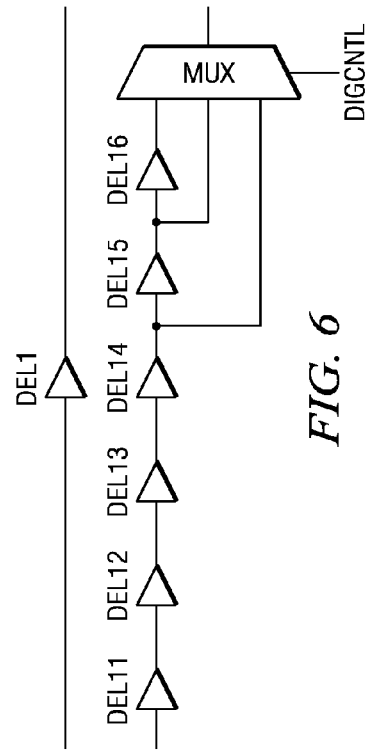
FIG. 6 shows a delay chain in a phase locked loop implemented according to the present invention.

FIG. 6 shows a simplified circuit diagram of a possible implementation of a delay chain in a phase locked loop according to the present invention. The delay chain includes delay elements DEL11 to DEL16 can be provided in a digital or analog controlled oscillator DCO1/VCO1 or DCO2/VCO2. FIG. 6 illustrates two delay chains can be included in a single oscillator to avoid the need to provide two oscillators. The outputs of delay elements DEL11 to DEL 16 are selected by multiplexer MUX as controlled by a digital control signal DIGCNTL.

What is claimed is:

1. An electronic device, comprising:
   a counter driven by a first input clock signal for counting clock cycles of the input clock signal and providing a predetermined set of most significant bits of a count;
   a clock signal generating stage driven by a second input clock signal for generating a first set of phase shifted clock signals having m different phases; and
   a code converter stage receiving the set of phase shifted clock signals for converting m states of the set of phase shifted clock signals into n least significant bits of the count, whereby the count consists of the predetermined set of most significant bits and the n least significant bits.

2. The electronic device according to claim 1, further comprising:
   a register for storing the states of the first set of phase shifted clock signals.

3. The electronic device according to claim 1, wherein:
   the clock signal generating stage includes a first chain of delay elements, each delay element having a delay smaller than a clock period of the input clock signal, a first delay element having an input receiving the input clock signal and an output, each other delay element having an input connected to an output of a prior delay element and an output, the first chain of delay elements providing the first set of m phase shifted clock signals at respective outputs.

4. The electronic device according to claim 3, wherein:
   the first chain of delay elements is a ring oscillator.

5. The electronic device according to claim 3, wherein:
   each delay element has a delay of $t_T$ equal to $2^{(-k)}/f_{IN}$, where k is an integer greater than 0 and $f_{IN}$ is the frequency of the input clock signal.

6. The electronic device according to claim 5, wherein:
   the number m of delayed clock signals is equal to $2^k$.

7. The electronic device according to claim 1, further comprising:
   a phase control loop coupled to synchronize the first set of phase shifted signals with the input clock signal.

8. The electronic device according to claim 1, further comprising:
   a frequency control loop coupled to synchronize the first set of phase shifted signals to the input clock signal.

9. The electronic device according to claim 1, wherein:
   the clock generating stage includes a flip-flop outputting a more significant bit of the count.

10. The electronic device according to claim 9, wherein:
    the flip-flop has an input receiving one of the first set of phase shifted clock signals.

11. The electronic device according to claim 1, wherein:
    the clock signal generating stage further generates a second set of m phase shifted clock signals; and
    the electronic device further comprises a controlling means switching between the first set of phase shifted clock signals and the second set of phase shifted clock signials.

12. The electronic device according to claim 1, further comprising:
    a decoding stage coupled to an output of the clock signal generating stage selecting one of the phase shifted clock signals to providing an edge of a pulse of a pulse width modulated signal within a period of the clock signal.

13. The electronic device of claim 1, wherein:
    said first clock signal is said second clock signal.

14. The electronic device of claim 1, wherein:
    said first clock signal is one of the first set of phase shifted clock signals.

15. The electronic device of claim 1, further comprising:
    a switch having a first input receiving the second clock signal, a second input receiving one of the first set of phase shifted clock signals and an output connected to the counter, whereby the first clock signal is selected as the second clock signal or the one of the first set of phase shifted clock signals.

16. A method of providing a timer value comprising:
    counting clock cycles of a first input clock signal so as to receive a count representing a plurality of most significant bit values of the timer value;
    generating a set of m phase shifted clock signals from a second input clock signal, each of the phase shifted clock signals being delayed with respect to another phase shifted clock signal by less than a clock period of the second input clock signal;
    determining a plurality of n least significant bit values based on the states of the phase shifted clock signals of the set of phase shifted clock signals; and
    composing the timer value by concatenating the n least significant bit values and the plurality of most significant bit values.

17. The method of providing a timer value of claim 16, further comprising:
    selecting one of the phase shifted clock signals; and
    adjusting an edge of a pulse of a pulse width modulated signal within a period of the clock signal using the selected clock signal.

18. The method of claim 16, wherein:
    the first clock signal is the second clock signal.

19. The method of claim 16, wherein:
    the first clock signal is one of the set of m phase shifted clock signals.

20. The method of claim 16, wherein:
    the first clock signal is a selectable one of the second clock signal or the one of the set of m phase shifted clock signals.

* * * * *